(12) United States Patent
Eshel

(10) Patent No.: US 6,775,186 B1
(45) Date of Patent: Aug. 10, 2004

(54) LOW VOLTAGE SENSING CIRCUIT FOR NON-VOLATILE MEMORY DEVICE

(75) Inventor: Noam Eshel, Pardesiya (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 10/613,845

(22) Filed: Jul. 3, 2003

(51) Int. Cl.[7] .............................................. G11C 16/06
(52) U.S. Cl. ............................... 365/185.21; 365/185.2
(58) Field of Search ........................ 365/185.2, 185.21, 365/205, 207, 208

(56) References Cited

U.S. PATENT DOCUMENTS

| | | | | |
|---|---|---|---|---|
| 5,029,138 A | * | 7/1991 | Iwashita ................ | 365/185.21 |
| 5,157,626 A | | 10/1992 | Watanabe | |
| 5,197,028 A | * | 3/1993 | Nakai .................... | 365/185.21 |
| 5,237,534 A | * | 8/1993 | Tanaka et al. ......... | 365/185.21 |
| 5,390,147 A | * | 2/1995 | Smarandoiu et al. .. | 365/185.21 |
| 5,694,363 A | | 12/1997 | Calligaro et al. | |
| 5,757,697 A | * | 5/1998 | Briner ................... | 365/185.21 |
| 5,812,456 A | | 9/1998 | Hull et al. | |
| 6,128,226 A | | 10/2000 | Eitan et al. | |
| 6,292,397 B1 | | 9/2001 | Kim | |
| 6,363,015 B1 | * | 3/2002 | Barcella et al. ........ | 365/185.21 |
| 6,459,620 B1 | | 10/2002 | Eshel | |

OTHER PUBLICATIONS

Razavi: "Design Of Analog CMOS Integrated Circuits", McGraw–Hill, International Edition 2001, pp. 482–531.

* cited by examiner

Primary Examiner—Son Mai
(74) Attorney, Agent, or Firm—Bever, Hoffman & Harms, LLP; Patrick T. Bever

(57) ABSTRACT

Low voltage sensing circuits for non-volatile memory (NVM) devices including a comparator (operational amplifier) having input terminals connected to the gate terminals of first and second PMOS transistors. The PMOS transistors are coupled between a system voltage source and respective bit lines carrying cell and reference currents from a selected NVM cell and a reference NVM cell, respectively. To facilitate low system voltages, voltage supply or source-follower circuits are connected between the gate and drain terminals of each PMOS transistor such that the bit line voltages are increased without increasing the voltage signals applied to the input terminals of the comparator, and without the use of charge pumps.

20 Claims, 5 Drawing Sheets

LOW VOLTAGE SENSING CIRCUIT FOR NON-VOLATILE MEMORY DEVICE

FIELD OF THE INVENTION

The present invention relates to sense amplifier circuits used to detect the states of non-volatile memory cells in a non-volatile memory array.

BACKGROUND OF THE INVENTION

Electrically erasable and programmable read only memories (EEPROMs) and flash erasable and programmable read only memories (flash EPROMs) are two types of non-volatile memory (NVM) devices. NVM cells typically comprise a sort of modified field-effect transistor (FET) that includes an electrically isolated floating gate (e.g., polycrystalline silicon or oxide-nitride-oxide (ONO)) for controlling conduction between source and drain regions of the EEPROM cell. A gate dielectric (bottom oxide) is formed between the floating gate and an underlying channel region between the source and drain regions. A control gate is provided adjacent to (e.g., above) the floating gate, and is separated from the floating gate by an inter-gate dielectric (top oxide). The data value stored by an EEPROM cell is determined by the amount of charge stored in the floating gate, which is controlled during program and erase operations by applying predetermined voltages across the floating gate. For example, during a program (write) operation, a net negative charge is transferred to and stored by the floating gate using a technique such as hot electron injection or Fowler-Nordheim (FN) tunneling. In this programmed state, the negative charge stored by the floating gate resists current flow between the source and drain regions of the memory cell when the control gate is asserted (i.e., pulled high). Conversely, an erase v operation transfers a neutral charge to the floating gate using FN tunneling. In the erased state, the neutral charge stored by the floating gate permits current flow between the source and drain regions of the memory cell when the control gate is asserted. NVM devices have an advantage over other volatile memories (e.g., static random access memory (SRAM) devices or dynamic RAM (DRAM) devices) in that the floating gate charge is stored essentially indefinitely (i.e., until a subsequent program/erase operation). That is, the charge stored by the floating gate of an NVM cell is retained even if power to the NVM device is disconnected, whereas data stored in volatile memory devices is lost when power is disconnected.

FIG. 1 is a simplified block diagram showing a conventional non-volatile memory (NVM) device 100. NVM device 100 includes an array 110 of NVM cells 115, and peripheral control circuitry located around array 110 including an input/output (I/O) control circuit 120, a word line control circuit 130, an optional address decoder 135, a bit line control circuit 140, a bit line (Y) decoder 145, and a sense amplifier circuit 150. NVM cells 115 are arranged in rows and columns such that the control gates of each row of NVM cells 115 are connected to an associated word line WL0 through WL7, and each column of NVM cells 115 is connected to an associated pair of bit lines BL0 through BL8. As indicated on the upper portion of FIG. 1, NVM device 100 also includes a reference NVM cell array 170 including several reference NVM cells. The reference NVM cells of reference NVM cell array 170 are utilized as discussed below.

Operation of NVM device 100 will now be briefly described with reference to FIG. 1.

During program and erase operations, address data and an associated data word are respectively transmitted via I/O control circuit 120 to word line control circuit 130 (via optional address decoder 135) and to bit line control circuit 140. Word line control circuit 130 uses the address data to pass an appropriate program/erase voltage onto an associated word line (e.g., word line WL0), and bit line control circuit 140 then drives selected bit lines to transmit appropriate program/erase voltage needed to program selected NVM cells 115 of the selected row. According to one convention, the NVM cells 115 that are programmed store a logic "1" data value, and those NVM cells that remain erased (unprogrammed) store a logic "0" data value. During "flash" erase operations, the word lines and bit lines are maintained at an appropriate voltage level that causes all programmed NVM cells 115 to be erased. Those of ordinary skill in the art will recognize that the above explanation is greatly simplified, and that many variations in the described operations are possible.

NVM cells 115 are typically read (sensed) by comparing currents $I_{CELL[0]}$–$I_{CELL[7]}$ passing through selected NVM cells (or voltages derived from the currents through the cells) to reference currents $I_{REF[0]}$–$I_{REF[7]}$ (or voltages) derived from corresponding reference cells in reference NVM array 170. In particular, during read operations, address data associated with selected data word is transmitted via I/O control circuit 120 to word line driver circuit 130, which uses the address data to apply an appropriate read voltage on the associated word line (e.g., word line WL1), thereby causing the selected currents $I_{CELL[0]}$–$ICELL[7]$ to pass from an associated word of the NMV cells onto, for example, bit lines BL0 through BL7. The thus-read data word is then transmitted via Y-decoder 145 to sense amplifier circuit 150, which compares the currents $I_{CELL[0]}$–$I_{REF[7]}$ with corresponding reference currents. $I_{REF[0]}$–$I_{REF[7]}$. When the sensed current (or voltage) read from a particular NVM cell 115 is larger than the corresponding reference current (or voltage) generated by the reference NVM cell, the NVM cell 115 is considered to be erased. Conversely, if the sensed current (or voltage) is smaller than the corresponding reference current (or voltage), the read NVM cell 115 is considered to be programmed. Sense amplifier circuit, 150 then outputs detected data values D[0]–D[7] based on these comparisons to I/O control circuit 120 for transmission out of NVM device 100.

FIG. 2 is a simplified circuit diagram showing a portion of conventional NVM circuit 100 that illustrates a conventional sensing scheme for determining the programmed/erased state of a selected NVM cell 115-1. In particular, FIG. 2 shows portions of NVM array 110, bit line control circuit 140, Y-decoder circuit 145, sense amplifier circuit 150, and reference array 170. The portion of NVM array 110 shown in FIG. 2 includes a selected NVM cell 115-1, which is connected between bit lines BL0 and BL1 and is controlled by a word line voltage transmitted on word line WL1. FIG. 2 also shows a portion of reference NVM array 170 including a reference NVM cell 115-R1, which is connected between reference bit lines BLR0 and BLR1 and is controlled by a word line voltage transmitted on a word line WLR1 (which may be the same word line WL1 used to access selected NVM cell 115-1).

Bit line control circuit 140 and Y-decoder circuit 145, which are typically implemented by multiplexing circuits, are represented by a pass transistors 240 and 245, respectively, which are controlled by control signals $V_{COL\_SEL1}$ and $V_{COL\_SEL}$, respectively.

Sense amplifier circuit 150 includes a comparator (e.g., operational amplifier) 250 having a first (inverting) input terminal connected to a node N1, and a second (non-inverting) input terminal connected to a reference node RN1. Node N1 is connected to the gate and drain terminals of a first PMOS transistor 252, whose source terminal is connected to system voltage $V_{DD}$. Node N1 is also coupled to bit line BL1 via a first NMOS clamp transistor 254, whose conductance is controlled by a bias voltage $V_{BIAS}$ to prevent soft programming, and via pass transistor 245 of Y-decoder circuit 145. Reference node RN1 is connected to the gate and drain terminals of a second PMOS transistor 254, whose source terminal is also connected to system voltage $V_{DD}$. Reference node RN1 is coupled to reference array 170 via a second NMOS clamp transistor 257, which is also controlled by bias voltage $V_{BIAS}$. Note that PMOS transistors 252 and 257 have a relatively small transconductance, and NMOS transistor 254 and 259 have a relatively large transconductance.

Similar to NVM array 110, reference array 170 includes a reference cell 115-R1 connected between first reference bit line BLR0 and second reference bit line BLR1, and is controlled by a word line voltage transmitted on reference word line WLR1. Reference bit line BLR0 is selectively coupled to ground through a multiplexer 272, which is represented by a pass-transistor 273, using a reference control voltage $V_{REF\_COL\_SEL1}$. Similarly, reference bit line BLR1 is selectively coupled to sense amplifier 150 through a multiplexer 275, which is represented by a pass transistor 277, using a reference control voltage $V_{REF\_COL\_SEL}$.

According to the example depicted in FIG. 2, NVM cell 115-1 is read by comparing a cell current $I_{CELL[1]}$ passing through NVM cell 115-1 with a reference current $I_{REF[1]}$ passing through reference NVM cell 115-R1. Cell current $I_{CELL[1]}$ is generated by coupling bit line BL0 to ground via bit line control circuit 140 (e.g., by turning on pass transistor 240), and coupling bit line BL1 to sense amplifier circuit 150 via Y-decoder 145 (e.g., by turning on pass transistor 245). Similarly, reference current $I_{REF[1]}$ is generated by coupling reference bit line BLR0 to ground (e.g., by turning on pass transistor 273), and coupling reference bit line BLR1 to sense amplifier circuit 150 (e.g., by turning on pass transistor 275). Cell current $I_{CELL[1]}$ of selected NVM cell 115-1 is converted to a corresponding cell voltage on node N1, which in turn is applied to the first input terminal of comparator 250. Reference current $I_{REF[1]}$ of reference cell 115-R1 is converted into a corresponding second voltage on reference node RNl, which is applied to the second input terminal of comparator 250. When cell current $I_{CELL[1]}$ through NVM cell 115-1 (or the corresponding voltage at node N1) is larger than reference current $I_{REF[1]}$ through reference NVM cell 115-R1 (or the corresponding voltage at reference node RN1), NVM cell 115-1 is considered to be erased, and comparator 250 generates a high voltage data output signal D[1]. Conversely, if the sensed cell current $I_{CELL[1]}$ (or voltage) is smaller than the reference current $I_{REF[1]}$ (or voltage), then NVM cell 115-1 is considered to be programmed, and comparator 250 generates a low voltage data output signal D[1].

Recently it has become increasingly desirable to reduce the supply voltage $V_{DD}$ of NVM arrays from sub-3 Volts to sub-2 Volts for use in low power applications, such as hand held digital devices. However, reducing supply voltage $V_{DD}$ below 3 Volts using the conventional sensing scheme described above is not possible due to voltage drops caused by the various multiplexers. As mentioned above, clamp transistors 254 and 259 are required to avoid soft programming. The source voltage of clamp transistor 254 limits the bit line voltage on bit line BL1 to $V_{BIAS}$ minus the threshold voltage of clamp transistor 254. Therefore, the minimum supply voltage $V_{DD}$ required to read NVM cell 115-1 may be represented by:

$$V_{DD}(\min) = V_{BITLINE} + V_{DSN(254)} + V_{TP} + \Delta V_{DSP} \quad \text{(EQ. 1)}$$

where $V_{BITLINE}$ is the voltage on bit line BL1, $V_{DSN}(254)$ is the voltage across clamp NMOS transistor 254, $V_{TP}$ is the threshold voltage of PMOS transistor 252, and $\Delta V_{DSP}$ is the "effective" voltage $V_{GS}$-$V_{TP}$ of PMOS transistor 252. That is, $\Delta V_{DSP}$ equals $$\sqrt{\frac{2 * I_{CELL} * (L_p / W_p)}{(\mu_{0P} * C_{0X})}}$$

(under the most simple MOS transistor model for saturation operating region), and is linearly related to the square root of the cell current $I_{CELL}$ through PMOS transistor 252. For example, assuming $V_{BITLINE}$ is limited to 1 Volt, $V_{DSN}$=0.2 Volts, $V_{TP}$=1 Volt, and $\Delta V_{DSP}$=0.3 Volts, then the minimum value for $V_{DD}$ is limited to above 2.5 Volts.

One approach utilized to facilitate the use of a sub-2 Volt supply voltage to drive an NVM device is to utilize charge pumps that generate sufficiently high bit line voltages from the sub-2 Volt supply to support the conventional sensing scheme described above. However, in addition to producing high bit line voltages, charge pumps generate significant noise (i.e., voltage "ripple") that can affect the accuracy of the sense amplifier. In addition, the inherent low power efficiency of the charge pump will cause excessive power consumption and reduced battery life.

What is needed is a sense amplifier and NVM cell sensing process that will both operate at very low system voltages (i.e., below 2.5 Volts) and minimize power consumption.

SUMMARY OF THE INVENTION

The present invention is directed to low voltage sensing circuits for NVM devices that utilizes voltage supply circuits or source-follower circuits to increase bit line currents/voltages using a low (i.e., sub-2 Volt) supply voltage without the need for a charge pump, thereby minimizing power consumption.

Similar to conventional sensing schemes that compare a bit line current (or voltage) generated by a selected NVM cell with a reference bit line current (or voltage) generated by a reference NVM cell, the sensing circuit of the present invention includes a comparator (e.g., an operational amplifier) and a pair of PMOS transistors that are respectively coupled to the bit line and the reference bit line. The comparators includes a first (e.g., inverting) input terminal connected to the gate terminal of a first PMOS transistor, which is coupled to the bit line, and a second (e.g., non-inverting) input terminal connected to the gate terminal of a second PMOS transistor, which is coupled to the reference bit line.

In accordance with a first embodiment of the present invention, a voltage supply is connected between the gate and drain terminals of each PMOS transistor such that the voltage at the drain terminal of each PMOS transistor is a predetermined voltage level above the voltage applied to the corresponding comparator input terminal. Accordingly, the voltages passed to the cell bit line and reference bit line are increased to facilitate proper NVM cell read operations, while the voltage applied to the comparator input terminals remains relatively low. By sensing currents through (or voltages across) the selected NVM cell and reference NVM cell in this manner, the minimum system voltage required to drive the NVM device is reduced to sub-2 Volts without requiring a charge pump. Further, the sensing circuit of the present invention facilitates operation of the PMOS transistors in their linear region, as opposed to saturated operation, thereby allowing an even further reduction in the required minimum system voltage.

In accordance with a second embodiment of the present invention, a source-follower circuit is connected between the gate and drain terminals of each PMOS transistor, thereby increasing the voltage at the drain terminal of each PMOS transistor by a predetermined voltage level in a manner similar to that of the first embodiment (discussed above). Each source-follower includes an NMOS transistor connected in series with a current source circuit between the system voltage and ground. The gate terminal of each NMOS transistor is connected to the drain terminal of its corresponding PMOS transistor, and a node located between the NMOS transistor and current source is connected to the corresponding input terminal of the comparator.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

Figure 3:
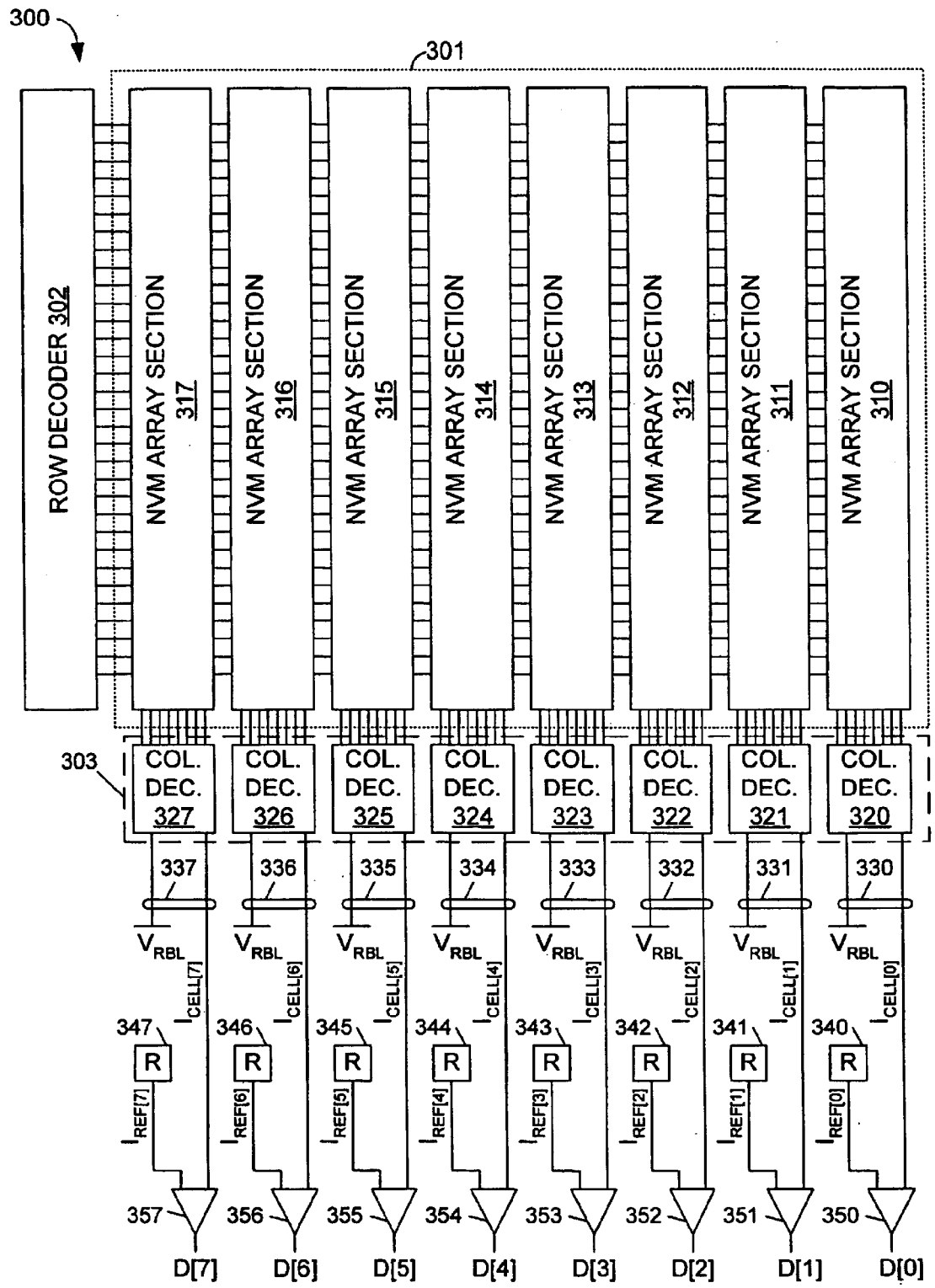
FIG. 3 is a simplified block diagram showing an NVM device including a low voltage circuit for sensing a data value stored in an NVM cell according to an embodiment of the present invention.

FIG. 3 is a block diagram showing a non-volatile memory system 300 in accordance with one embodiment of the present invention. NVM system 300 includes an array of non-volatile memory cells 301, row decoder 302, column decoder 303 (which includes column decoder blocks 320–327), bit line pairs 330–337, one or more non-volatile memory reference blocks 340–347, and comparator circuits 350–357. NVM array 301 includes eight NVM array sections 310–317. In the described example, each of NVM array sections 310–317 includes 32 rows and eight columns of memory cells. Thirty-two word lines therefore extend between row decoder 302 and each of the NVM array sections 310–317. Row decoder 302 asserts a word line read voltage $V_{RWL}$ (e.g., 0 Volts) on one of the thirty-two word lines in response to a row address provided for a read operation.

Eight bit line pairs extend between each of NVM array sections 310–317 and column decoder blocks 320–327, respectively. Each of column decoder blocks 320–327 couples one of its eight received bit line pairs to bit line pairs 330–337, respectively, in response to a column address provided for a read operation. One of the bit lines in each of bit line pairs 330–337 is coupled to receive a bit line read voltage $V_{RBL}$ during a read operation. The other bit lines in bit line pairs 330–337 pass cell currents $I_{CELL[0]}$–$I_{CELL[7]}$ from respective NVM cells of NVM array sections 310–317, and are coupled to the signal input terminals of comparator circuits 350–357, respectively. The reference input terminals of comparator circuits 350–357 are coupled to receive reference currents $I_{REF[0]}$–$I_{REF[7]}$, respectively, from NVM reference blocks 340–347, respectively. Note that in an alternative embodiment (not shown) a single reference block may be used to provide a shared reference signal to comparator circuits 350–357. In response to the applied cell currents and reference signal(s), comparator circuits 350–357 provide output data signals D[0]–D[7], respectively. Note that each of comparator circuits 350–357 has a dedicated NVM reference block 340–347. As described above, each NVM cell of the NVM reference blocks 340–347 is programmed in response to the internal voltage offsets present in the corresponding one of comparator circuits 350–357.

Figure 4:
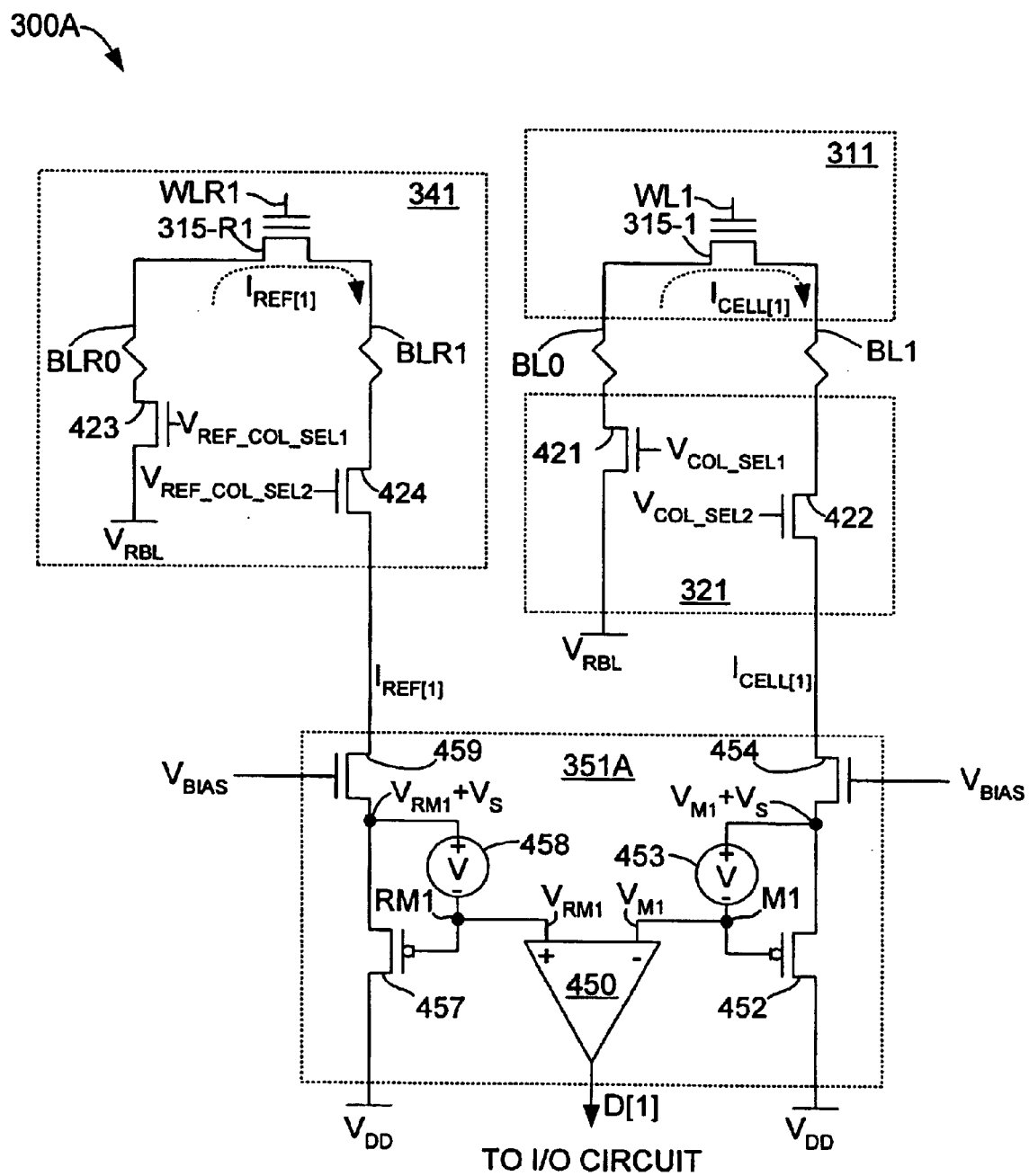
FIG. 4 is a simplified schematic diagram showing the low voltage comparator circuit utilized in the NVM device of FIG. 3 according to a first specific embodiment of the present invention.

FIG. 4 is a simplified circuit diagram showing a portion of an NVM circuit 300A illustrating a sensing scheme for determining the programmed/erased state of a selected NVM cell 315-1 according to a first specific embodiment of the present invention. In particular, NVM circuit 300A includes portions of NVM array section 311, column decoder circuit 321, NVM reference block 341, and comparator-circuit 351A of NVM circuit 300 (FIG. 3), as modified according to the first embodiment.

The portion of NVM array section 311 shown in FIG. 4 includes a selected NVM cell 315-1, which is connected between bit lines BL0 and BL1 and is controlled by a word line voltage transmitted on word line WL1. As indicated in FIG. 4, bit line BL0 is selectively coupled to read voltage $V_{RBL}$ through a first portion of column decoder (multiplexer) circuit 321, which is depicted by a pass transistor 421 that is controlled by a first column select signal $V_{COL\_SEL1}$. Similarly, bit line BL1 is selectively coupled to pass a cell current $I_{CELL[1]}$ through a second portion of column decoder (multiplexer) circuit 321, which is depicted by a pass transistor 422 that is controlled by a second column select signal $V_{COL\_SEL2}$.

FIG. 4 also shows a portion of reference NVM array 170 including a selected reference NVM cell 315-R1, which is connected between reference bit lines BLR0 and BLR1 and is controlled by a word line voltage transmitted on a word line WLR1. Reference bit line BLR0 is selectively coupled to read voltage $V_{RBL}$ through a multiplexer circuit, which is depicted by a pass transistor 423 that is controlled by a first reference column select signal $V_{REF\_COL\_SEL1}$. Similarly, reference bit line BLR1 is selectively coupled to pass a reference current $I_{REF[1]}$ through a second multiplexer, which is depicted by a pass transistor 424 that is controlled by a second reference column select signal $V_{REF\_COL\_SEL2}$.

Comparator (sense amplifier) circuit 351A includes a comparator (e.g., operational amplifier) 450 having a first (e.g., inverting) input terminal connected to a node M1, and a second (e.g., non-inverting) input terminal connected to a reference node RM1. Node M1 is connected to the gate terminal of a first PMOS transistor 452, and also to a first terminal of a first voltage source 453. The source terminal of first PMOS transistor 452 is connected to system voltage $V_{DD}$. The drain terminal of first PMOS transistor 452 connected to a second terminal of voltage source 453, and is coupled to bit line BL1 via a first NMOS clamp transistor 454, whose conductance is controlled by a bias voltage $V_{BIAS}$ to prevent soft programming, and via pass transistor 422 of column decoder circuit 321. Reference node RM1 is connected to the gate terminal of a second PMOS transistor 457, and also to a first terminal of a second voltage source 458. The source terminal of second PMOS transistor 457 is connected to system voltage $V_{DD}$. The drain terminal of second PMOS transistor 457 connected to a second terminal of second voltage source 458, and is coupled to bit line BL1 via a second NMOS clamp transistor 459, whose conductance is controlled by bias voltage $V_{BIAS}$. Note that PMOS transistors 452 and 457 have a relatively small transconductance, and NMOS transistor 454 and 459 have a relatively large transconductance.

Referring again to FIG. 4, similar to the conventional sensing scheme described above, NVM cell 315-1 is read by comparing a cell current $I_{CELL[1]}$ passing through NVM cell 315-1 with a reference current $I_{REF[1]}$ passing through reference NVM cell 315-R1. Cell current $I_{CELL[1]}$ is generated by coupling bit line BL0 to ground via pass transistor 421 of column decoder circuit 321, and coupling bit line BL1 to comparator circuit 351A via pass transistor 422 of column decoder circuit 321. Similarly, reference current $I_{REF[1]}$ is generated by coupling reference bit line BLR0 to ground (e.g., by turning on pass transistor 423), and coupling reference bit line BLR1 to comparator circuit 351A (e.g., by turning on pass transistor 424). Cell current $I_{CELL[1]}$ of selected NVM cell 315-1 is converted to a corresponding cell voltage $V_{M1}$ at node M1, which in turn in applied to the first input terminal of comparator 450. Reference current $I_{REF[1]}$ of reference cell 315-R1 is converted into a corresponding second voltage $V_{RM1}$ on reference node RM1, which is applied to the second input terminal of comparator 250. When cell current $I_{CELL[1]}$ through NVM cell 115-1 (or the corresponding voltage $V_{M1}$ at node M1) is larger than reference current $I_{REF[1]}$ through reference NVM cell 115-R1 (or the corresponding voltage $V_{RM1}$ at reference node RM1), NVM cell 315-1 is considered to be erased, and comparator 450 generates a high data output value D[1]. Conversely, if the sensed cell current $I_{CELL[1]}$ (or voltage $V_{M1}$) is smaller than the reference current $I_{REF[1]}$ (or voltage $V_{RM1}$), then NVM cell 115-1 is considered to be programmed.

According to the first embodiment of the present invention that is depicted in FIG. 4, voltage sources 453 and 458 are arranged such that voltage levels at the gate terminals of PMOS transistors 452 and 457 are a predetermined source voltage $V_S$ less than voltage levels at the drain terminals of PMOS transistors 452 and 457. As indicated in FIG. 4, the drain terminal of PMOS transistor 452 is maintained at a voltage level equal to the voltage level at node M1 (i.e., $V_{M1}$) plus the predetermined source voltage $V_S$. Similarly, the drain terminal of PMOS transistor 457 is maintained at a voltage level equal to the voltage level at reference node RM1 (i.e., $V_{RM1}$) plus the predetermined source voltage $V_S$. By providing voltage sources 453 and 458 between the drain and gate terminals of PMOS transistors 452 and 457, respectively, the gate terminals of PMOS transistors 452 and 457 are maintained at a relatively low voltage, while the drain voltage increases by predetermined source voltage $V_S$. Accordingly, the minimum voltage supply voltage $V_{DD}$ needed to drive NVM circuit 300A is:

$$V_{DD}(\min)=V_{BITLINE}+V_{DSN(254)}+V_{TP}+\Delta V_{DSP}-V_S \quad (EQ. 2)$$

where $V_{BITLINE}$ is the voltage on bit line BL1, $V_{DSN(254)}$ is the voltage across clamp NMOS transistors 454 and 459, $V_{TP}$ is the threshold voltage of PMOS transistors 452 and 457, and $\Delta V_{DSP}$ is the "effective" voltage $V_{GS-VTP}$ of PMOS transistors 452 and 457 (see discussion above regarding Equation 1). Assuming predetermined source voltage $V_S$ equals the absolute value of $V_{TP}$ minus 0.2 Volts (i.e., $V_S$=0.8 Volts), and substituting the other values used above into equation 2 (i.e., assuming $V_{BITLINE}$ is limited to 1 Volt, $V_{DSN}$=0.2 Volts, $V_{TP}$=1 Volt, and $\Delta V_{DSP}$=0.3 Volts), then the minimum system voltage $V_{DD}$ is 1.7 Volts. Accordingly, the low voltage comparator (sensing) circuit of the present invention provides a significant advantage over conventional sensing schemes in that the present invention supports a minimum required system voltage $V_{DD}$ that is sub-2 Volts when PMOS transistors 452 and 457 are saturated.

Figure 1:
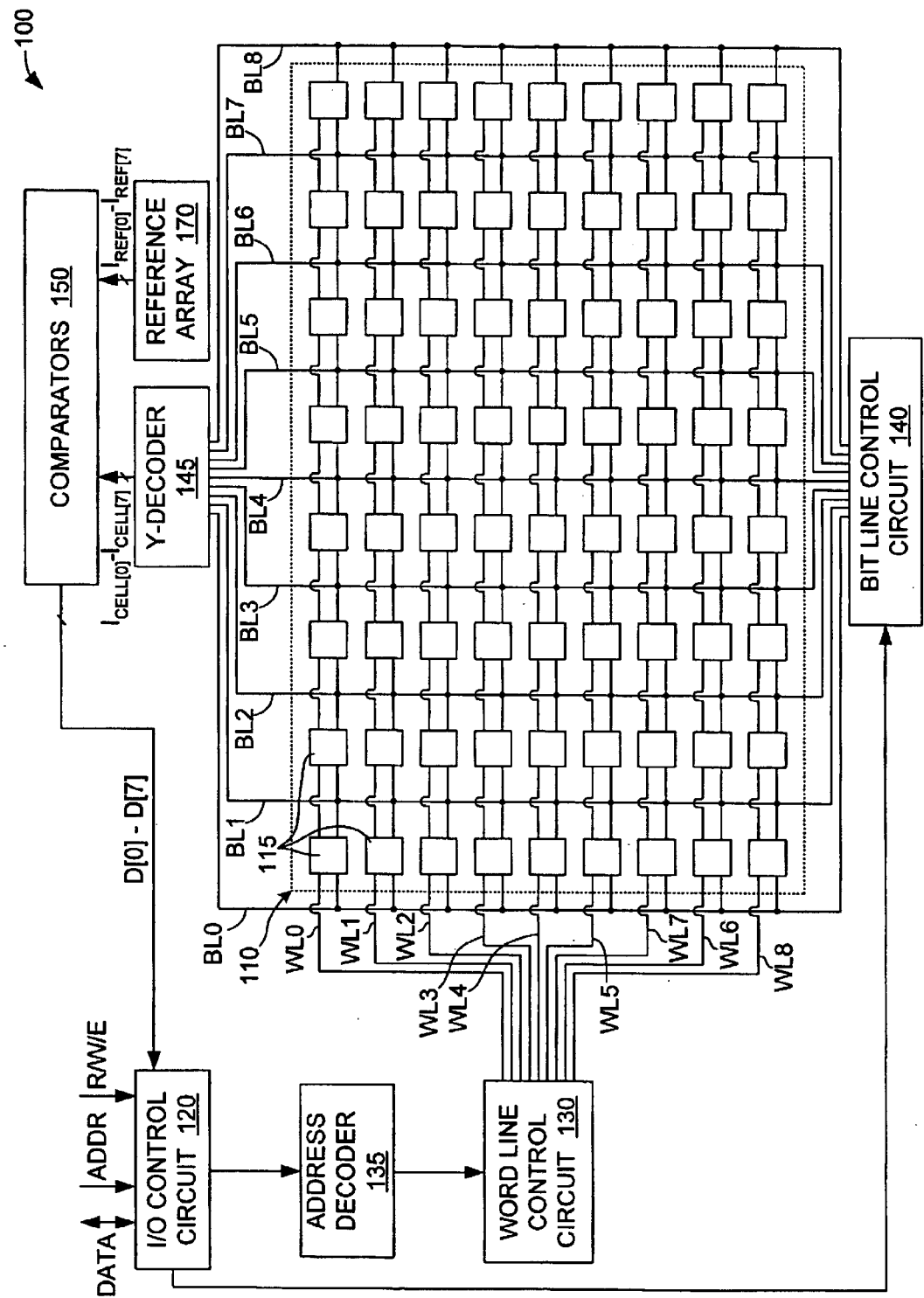
FIG. 1 is a simplified block diagram showing a conventional non-volatile memory (NVM) array.
Figure 2:
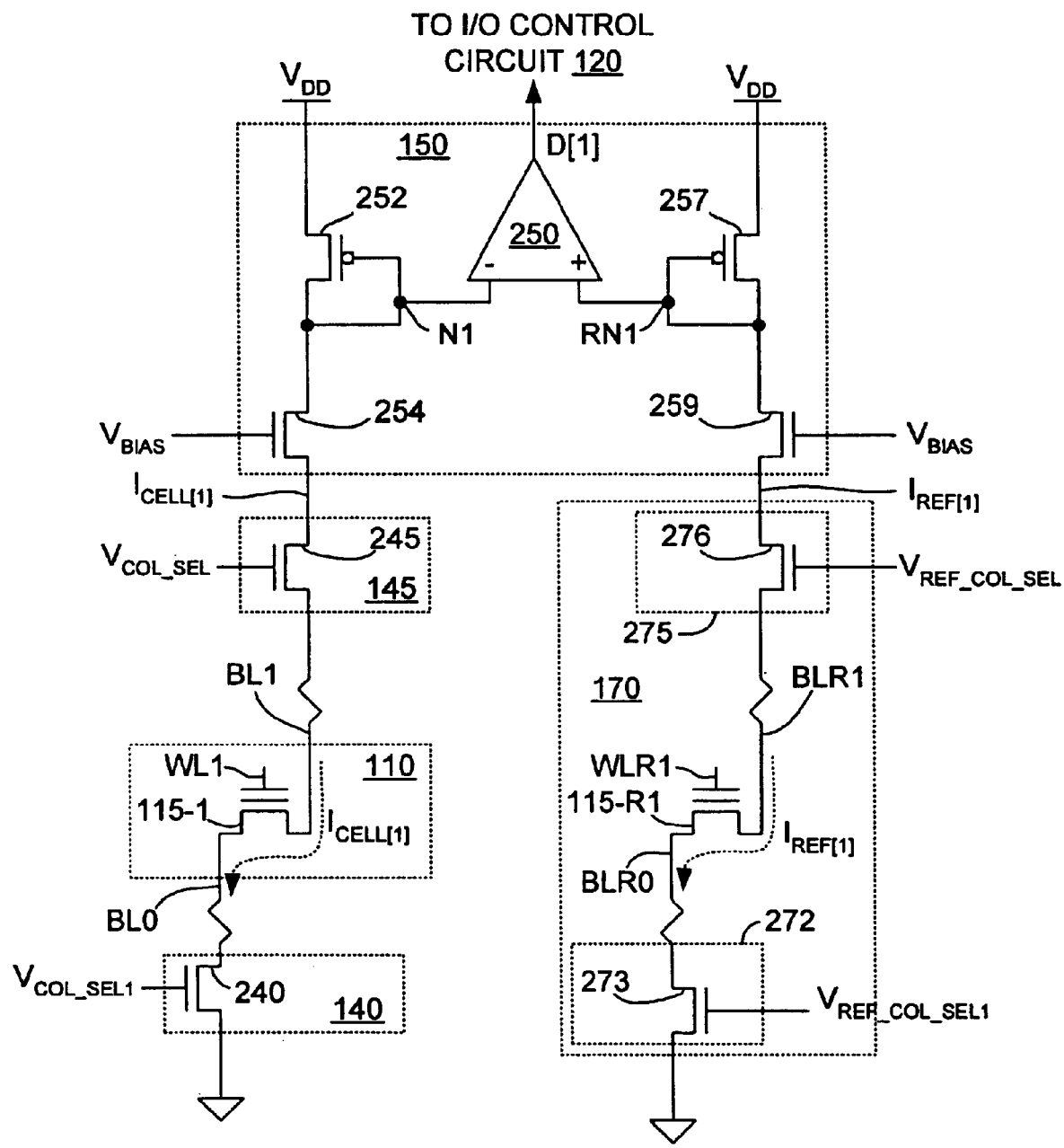
FIG. 2 is a simplified schematic diagram showing a conventional circuit for sensing a data value stored in an NVM cell of the array shown in FIG. 1.

Note that equation 2 (above) assumes PMOS transistors 452 and 457 are in saturation (i.e., the absolute value of $V_S$ is less than the absolute value of $V_{TP}$). However, unlike the conventional scheme described above with reference to FIG. 2, PMOS transistors 452 and 457 are not limited to saturated operation only. That is, NVM circuit 300A will also operate when PMOS transistors 452 and 457 are operated in their respective linear operating regions, thus enabling even further reductions in the minimum system voltage $V_{DD}$. For example, in the case where predetermined source voltage $V_S$ is larger than the absolute value of $V_{TP}$, PMOS transistors 452 and 457 are operated in their respective linear operating regions, and the minimum supply voltage $V_{DD}$ becomes:

$$V_{DD}(\min)=V_{BITLINE}+V_{DSN(454)}+\Delta V_{DSP} \quad (EQ. 3)$$

When PMOS transistors 452 and 457 are operating in the linear region, the gain of the comparator input voltage to a gain in the cell current is smaller than in the case where both PMOS transistors 452 and 457 operate in saturation, causing the input signal to comparator 450 to be smaller. Note that the value $\Delta V_{DSP}$ has to be carefully chosen to enable both sufficient gain and sufficient reduction in the minimum supply voltage $V_{DD}$. Assuming 200 mV is a reasonable value for this purpose, the value of $\Delta V_{DSP}$ becomes 0.2 Volts. Substituting this value into equation 3 along with other values used above to determine the minimum supply voltage using the conventional sensing scheme, (i.e., assuming $V_{BITLINE}$ is limited to 1 Volt, and $V_{DSN}$=0.2 Volts), then the minimum system voltage $V_{DD}$ is 1.4 Volts, which provides an even greater advantage over conventional sensing schemes.

As set forth by the above examples, by providing voltage sources 453 and 458 between the drain and gate terminals of PMOS transistors 452 and 457, respectively, the gate terminals of PMOS transistors 452 and 457 are maintained at a relatively low voltage, while the drain voltage increases by predetermined source voltage $V_S$, thereby facilitating a significant reduction in the minimum allowable supply voltage $V_{DD}$.

Figure 5:
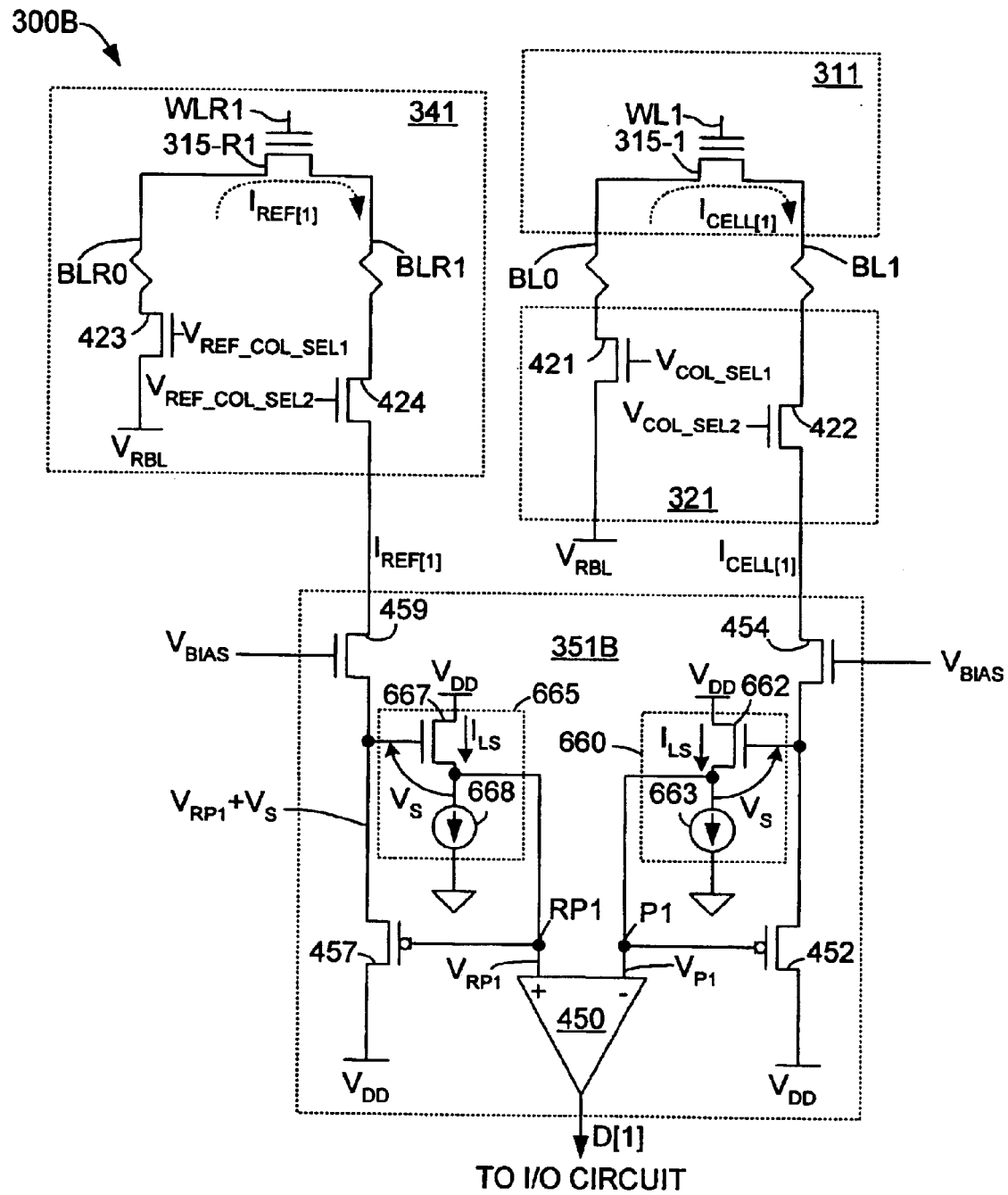
FIG. 5 is a simplified schematic diagram showing the low voltage comparator circuit utilized in the NVM device of FIG. 3 according to a second specific embodiment of the present invention.

FIG. 5 is a simplified circuit diagram showing a portion of an NVM circuit 300B illustrating a sensing scheme for determining the programmed/erased state of a selected NVM cell 315-1 according to a second embodiment of the present invention. In particular, NVM circuit 300B includes portions of NVM array section 311, column decoder circuit 321, NVM reference block 341, and a comparator circuit 351B of NVM circuit 300 (FIG. 3), as modified according to the first embodiment of the present invention. Note that the portions of NVM array section 311, reference NVM array 170, and column decoder circuit 321 are essentially identical to those described above with reference to FIG. 4, and therefore specific discussion of the elements (which are identified with reference numbers identical to those used in FIG. 4) is omitted for brevity. In addition, circuit elements of comparator circuit 351B that are essentially identical to those of comparator circuit 351A (described above) are also identified with the same reference numbers.

Referring to FIG. 5, comparator circuit 351B includes comparator (e.g., operational amplifier) 450, first and second PMOS transistors 452 and 457, first and second NMOS clamp transistors 454 and 459, and first and second source-follow (level shifter) circuits 660 and 665. Similar to the first embodiment, comparator 450 has a first (e.g., inverting) input terminal connected to a node P1 that is connected to the gate terminal of first PMOS transistor 452, and a second (e.g., non-inverting) input terminal connected to a reference node RP1 that is connected to the gate terminal of second PMOS transistor 457. Similar to the sensing schemes described above, NVM cell 315-1 is read by comparing a cell current $I_{CELL[1]}$ passing through NVM cell 315-1 with a reference current $I_{REF[1]}$ passing through reference NVM cell 315-R1. As in the first embodiment, comparator 450 generates an output data value D[1] according to voltages $V_{P1}$ and $V_{RP1}$, which are directly related to cell current $I_{CELL[1]}$ and reference current $I_{REF[1]}$, respectively.

Similar to the voltage sources utilizing in the first embodiment (described above), source-follower circuits 660 and 665 increase the voltage on bit lines BL1 and BLR1 without increasing the voltages on the gate terminals of PMOS transistors 452 and 457, thereby facilitating NVM operation with a very low voltage source $V_{DD}$. Referring to the right side of comparator circuit 351B, source-follower circuit 660 includes an NMOS transistor 662 and a current source 663 that are connected in series between system voltage $V_{DD}$ and ground. In addition to its connection to the gate terminal of first PMOS transistor 452, node P1 is connected to a point located between NMOS transistor 662 and current source 663 of source-follower circuit 651. The source terminal of first PMOS transistor 452 is connected to system voltage $V_{DD}$. The drain terminal of first PMOS transistor 452 is coupled to bit line BL1 via first NMOS clamp transistor 454 and pass transistor 422 of column decoder circuit 321. The drain terminal of first PMOS transistor 452 is also connected to the gate terminal of NMOS transistor 662 of source-follower 660. Similarly, source-follower circuit 665 includes an NMOS transistor 667 and a current source 668 (e.g., an NMOS transistor controlled by a gate bias voltage) that are connected in series between system voltage $V_{DD}$ and ground, with reference node RP1 connected to a point located between NMOS transistor 667 and current source 668, and the drain terminal of first PMOS transistor 452 connected to the gate terminal of NMOS transistor 667. With this arrangement, a gate-to-source voltage $V_S$ is generated across, for example, NMOS transistor 662 that can be represented as:

$$V_S = V_{TN} + \sqrt{\frac{2 \cdot I_{LS} \cdot (L_N / W_N)}{(\mu_{0N} \cdot C_{OX})}} \quad \text{(EQ. 4)}$$

where $I_{LS}$ is the current through NMOS transistor 663, $W_N$ and $L_N$ are the width and length, respectively, of NMOS transistor 662, $\mu_{ON}$ is the zero field mobility, and $C_{OX}$ gate capacitance. In order to set the desired voltage $V_S$, the circuit designer may choose an NMOS transistor 662 from several possible devices to provide a threshold voltage $V_{TN}$ having the desired value (i.e., either an intrinsic $V_T$ NMOS device, or a high/medium $V_T$ NMOS device), the desired level shifter current $I_{LS}$, and the desired aspect ratio of NMOS transistor 663. The resulting circuit has benefits similar to those described above with reference to NVM device 300A.

Although the present invention has been described with respect to certain specific embodiments, it will be clear to those skilled in the art that the inventive features of the present invention are applicable to other embodiments as well, all of which are intended to fall within the scope of the present invention. For example, although the present invention is described using an array 301 having a particular size and configuration, it is understood that the invention is not limited to this size or configuration. One of ordinary skill in the art would be capable of creating arrays having different sizes and configurations in view of the description provided herein. Thus, the invention is limited only by the following claims.

What is claimed is:

1. A low voltage sensing circuit for a non-volatile memory (NVM) device, the NVM device including a plurality of NVM cells including a first NVM cell coupled to a first bit line and a reference NVM cell coupled to a second bit line, wherein the low voltage sensing circuit comprises:
    a first PMOS transistor having a first terminal connected to a system voltage source, a second terminal coupled to the first bit line, and a gate terminal;
    a second PMOS transistor having a first terminal connected to the system voltage source, a second terminal coupled to the second bit line, and a gate terminal;
    a comparator having a first input terminal and a second input terminal;
    a first voltage source circuit connected between the second terminal of the first PMOS transistor and the first input terminal of the comparator; and
    a second voltage source circuit connected between the second terminal of the second PMOS transistor and the second input terminal of the comparator.

2. The low voltage sensing circuit according to claim 1, further comprising a first NMOS transistor having a first terminal connected to the second terminal of the first PMOS transistor, a second terminal coupled to the first bit line, and a gate terminal connected to a bias voltage source.

3. The low voltage sensing circuit according to claim 2, wherein the first terminal of the first NMOS transistor is connected to a positive terminal of the first voltage source circuit.

4. The low voltage sensing circuit according to claim 2, further comprising a second NMOS transistor having a first terminal connected to the second terminal of the second PMOS transistor, a second terminal coupled to the second bit line, and a gate terminal connected to the bias voltage source.

5. The low voltage sensing circuit according to claim 4,
    wherein the first terminal of the first NMOS transistor is connected to a positive terminal of the first voltage source circuit, and
    wherein the first terminal of the second NMOS transistor is connected to a positive terminal of the second voltage source circuit.

6. A non-volatile memory (NVM) device comprising:
    an array of NVM cells including a first NVM cell coupled to a first bit line and a reference NVM cell coupled to a second bit line; and
    a low voltage sensing circuit for determining a programmed/erased state of the first NVM cell, the low voltage sensing circuit including:
        a first PMOS transistor having a first terminal connected to a system voltage source, a second terminal coupled to the first bit line, and a gate terminal;
        a second PMOS transistor having a first terminal connected to the system voltage source, a second terminal coupled to the second bit line, and a gate terminal;

a comparator having a first input terminal and a second input terminal;

a first voltage source circuit connected between the second terminal of the first PMOS transistor and the first input terminal of the comparator; and a second voltage source circuit connected between the second terminal of the second PMOS transistor and the second input terminal of the comparator.

7. The NVM device according to claim 6, wherein the low voltage sensing circuit further comprises a first NMOS transistor having a first terminal connected to the second terminal of the first PMOS transistor, a second terminal, coupled to the first bit line, and a gate terminal connected to a bias voltage source.

8. The NVM device according to claim 7, wherein the first terminal of the first NMOS transistor is connected to a positive terminal of the first voltage source circuit.

9. The NVM device according to claim 7, wherein the low voltage sensing circuit further comprises a second NMOS transistor having a first terminal connected to the second terminal of the second PMOS transistor, a second terminal coupled to the second bit line, and a gate terminal connected to the bias voltage source.

10. The NVM device according to claim 9,
wherein the first terminal of the first NMOS transistor is connected to a positive terminal of the first voltage source circuit, and
wherein the first terminal of the second NMOS transistor is connected to a positive terminal of the second voltage source circuit.

11. A low voltage sensing circuit for a non-volatile memory (NVM) device, the NVM device including a plurality of NVM cells including a first NVM cell coupled to a first bit line and a reference NVM cell coupled to a second bit line, wherein the low voltage sensing circuit comprises:

a first PMOS transistor having a first terminal connected to a system voltage source, a second terminal coupled to the first bit line, and a gate terminal;

a second PMOS transistor having a first terminal connected to the system voltage source, a second terminal coupled to the second bit line, and a gate terminal;

a comparator having a first input terminal connected to the gate terminal of the first PMOS transistor, and a second input terminal connected to the gate terminal of the second PMOS transistor;

a first source-follower circuit connected between the second terminal of the first PMOS transistor and the first input terminal of the comparator; and a second source-follower circuit connected between the second terminal of the second PMOS transistor and the second input terminal of the comparator.

12. The low voltage sensing circuit according to claim 11, further comprising a first NMOS transistor having a first terminal connected to the second terminal of the first PMOS transistor, a second terminal coupled to the first bit line, and a gate terminal connected to a bias voltage source.

13. The low voltage sensing circuit according to claim 12, wherein the first source-follower circuit comprises:

a current source having a first terminal connected to ground;

a second NMOS transistor having a first terminal connected to a second terminal of the current source and to the first input terminal of the comparator, a second terminal connected to the system voltage source, and a gate terminal connected to the first terminal of the first NMOS transistor.

14. The low voltage sensing circuit according to claim 13, further comprising a third NMOS transistor having a first terminal connected to the second terminal of the second PMOS transistor, a second terminal coupled to the second bit line, and a gate terminal connected to the bias voltage source.

15. The low voltage sensing circuit according to claim 14, wherein the second source-follower circuit comprises:

a second current source having a first terminal connected to ground;

a fourth NMOS transistor having a first terminal connected to a second terminal of the second current source and to the second input terminal of the comparator, a second terminal connected to the system voltage source, and a gate terminal connected to the first terminal of the third NMOS transistor.

16. A non-volatile memory (NVM) device comprising:

an array of NVM cells including a first NVM cell coupled to a first bit line and a reference NVM cell coupled to a second bit line; and a low voltage sensing circuit for determining a programmed/erased state of the first NVM cell, the low-voltage sensing circuit including:

a first PMOS transistor having a first terminal connected to a system voltage source, a second terminal coupled to the first bit line, and a gate terminal;

a second PMOS transistor having a first terminal connected to the system voltage source, a second terminal coupled to the second bit line, and a gate terminal;

a comparator having a first input terminal connected to the gate terminal of the first PMOS transistor, and a second input terminal connected to the gate terminal of the second PMOS transistor;

a first source-follower circuit connected between the second terminal of the first PMOS transistor and the first input terminal of the comparator; and a second source-follower circuit connected between the second terminal of the second PMOS transistor and the second input terminal of the comparator.

17. The NVM device according to claim 16, wherein the low voltage sensing circuit further comprises a first NMOS transistor having a first terminal connected to the second terminal of the first PMOS transistor, a second terminal coupled to the first bit line, and a gate terminal connected to a bias voltage source.

18. The NVM device according to claim 17, wherein the first source-follower circuit comprises:

a current source having a first terminal connected to ground;

a second NMOS transistor having a first terminal connected to a second terminal of the current source and to the first input terminal of the comparator, a second terminal connected to the system voltage source, and a gate terminal connected to the first terminal of the first NMOS transistor.

19. The NVM device according to claim 18, wherein the low voltage sensing circuit further comprises a third NMOS transistor having a first terminal connected to the second terminal of the second PMOS transistor, a second terminal coupled to the second bit line, and a gate terminal connected to the bias voltage source.

20. The low voltage sensing circuit according to claim 19, wherein the second source-follower circuit comprises:

a second current source having a first terminal connected to ground;

a fourth NMOS transistor having a first terminal connected to a second terminal of the second current source and to the second input terminal of the comparator, a second terminal connected to the system voltage source, and a gate terminal connected to the first terminal of the third NMOS transistor.

* * * * *